(12) United States Patent
Cher et al.

(10) Patent No.: US 11,537,290 B2
(45) Date of Patent: Dec. 27, 2022

(54) MANAGING HIGH PERFORMANCE STORAGE SYSTEMS WITH HYBRID STORAGE TECHNOLOGIES

(71) Applicant: INTERNATIONAL BUSINESS MACHINES CORPORATION, Armonk, NY (US)

(72) Inventors: Chen-Yong Cher, Port Chester, NY (US); Michele M. Franceschini, White Plains, NY (US); Ashish Jagmohan, Newcastle, NY (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 14/220,471

(22) Filed: Mar. 20, 2014

(65) Prior Publication Data

US 2015/0268856 A1 Sep. 24, 2015

(51) Int. Cl.
*G06F 3/06* (2006.01)
*G06F 12/02* (2006.01)
(Continued)

(52) U.S. Cl.
CPC ............ *G06F 3/061* (2013.01); *G06F 3/0634* (2013.01); *G06F 3/0653* (2013.01);
(Continued)

(58) Field of Classification Search
CPC ...... G06F 3/0604; G06F 3/061; G06F 3/0611; G06F 3/0613; G06F 3/0614; G06F 3/0616; G06F 3/0617; G06F 3/0619; G06F 3/0634; G06F 3/0635; G06F 3/068; G06F 3/0685; G06F 3/0683; G06F 2212/703;
(Continued)

(56) References Cited

U.S. PATENT DOCUMENTS 6,978,342 B1   12/2005   Estakhri et al.
7,340,581 B2    3/2008   Gorobets et al.
(Continued)

OTHER PUBLICATIONS

Definition of Likely—Merriam-Webter's Collegiate Dictionary.*
(Continued)

*Primary Examiner* — Tracy A Warren
(74) *Attorney, Agent, or Firm* — Tutunjian & Bitetto, P.C.; Vazken Alexanian

(57) ABSTRACT

There is provided a method for managing a solid state storage system with hybrid storage technologies. The method includes monitoring one or more storage request streams to identify operating mode characteristics therein from among a set of possible operating mode characteristics. The set of possible operating mode characteristics correspond to a set of available operating modes of the hybrid storage technologies. The method further includes identifying a current operating mode from among the set of available operating modes responsive to the identified operating mode characteristics. The method also includes predicting a likely future operating mode responsive to variations in workload requirements to generate at least one future operating mode prediction. The method additionally includes controlling at least one of data placement, wear leveling, and garbage collection, responsive to the at least one future operating mode prediction.

14 Claims, 2 Drawing Sheets

(51) Int. Cl.
*G11C 16/34* (2006.01)
*G11C 29/04* (2006.01)

(52) U.S. Cl.
CPC ........ *G06F 3/0685* (2013.01); *G06F 12/0246* (2013.01); *G11C 16/349* (2013.01); *G06F 2212/1041* (2013.01); *G06F 2212/7205* (2013.01); *G06F 2212/7208* (2013.01); *G06F 2212/7211* (2013.01); *G11C 2029/0409* (2013.01)

(58) Field of Classification Search
CPC ......... G06F 2212/7211; G06F 2212/72; G06F 2212/7208
See application file for complete search history.

(56) References Cited

U.S. PATENT DOCUMENTS

| | | | |
|---|---|---|---|
| 7,441,090 | B2 | 10/2008 | Estakhri et al. |
| 7,450,420 | B2 | 11/2008 | Sinclair et al. |
| 8,010,742 | B2 | 8/2011 | Molaro et al. |
| 8,122,223 | B2 | 2/2012 | Cantin et al. |
| 8,375,190 | B2 * | 2/2013 | Hamilton ................ G06F 3/061 711/156 |
| 8,812,744 | B1 * | 8/2014 | Iyigun ................... G06F 3/0608 710/15 |
| 2009/0319720 | A1 | 12/2009 | Stefanus et al. |
| 2010/0169540 | A1 * | 7/2010 | Sinclair ............... G06F 12/0246 711/103 |
| 2010/0262979 | A1 * | 10/2010 | Borchers ................. G06F 9/544 719/321 |
| 2012/0124273 | A1 * | 5/2012 | Goss .................... G11C 16/349 711/103 |
| 2012/0226962 | A1 * | 9/2012 | Franceschini ....... G06F 11/1012 714/766 |
| 2013/0297907 | A1 * | 11/2013 | Ki ....................... G06F 12/0684 711/170 |
| 2015/0248325 | A1 * | 9/2015 | Calderbank ......... G06F 11/1048 714/768 |

OTHER PUBLICATIONS

Ben-Aroya, A., "Competitive Analysis of Flash-Memory Algorithms" Tel-Aviv University Raymond and Beverly Sackler Faculty of Exact Sciences School of Computer Science. Apr. 2006. (58 Pages).

Chang, L., et al. "A Real-Time Garbage Collection Mechanism for Flash-Memory Storage Systems in Embedded Systems" The 9th International Conference on Real-Time Computing Systems and Applications. 2002. (9 Pages).

Chang, L., et al. "Real-Time Garbage Collection for Flash-Memory Storage Systems of Realtime Embedded Systems" ACM Transactions in Embedded Computing Systems, vol. 3, No. 4. Nov. 2004. (26 Pages).

Gal, E., et al. "Algorithms and Data Structures for Flash Memories" ACM Computing Serveys, vol. 37, No. 2. Jun. 2005. pp. 1-30.

Hu, X., et al. "Write Amplification Analysis in Flash-Based Solid State Drives" Proceedings of of SYSTOR 2009: The Israeli Experimental Systems Conference 2009. May 2009. (9 Pages).

Kawaguchi, A., et al. "A Flash-Memory Based File System" USENIX 1995 Technical Conference on UNIX and Advanced Computing Systems. Jan. 1995. (10 Pages).

Menon, J., et al. "An Age-Threshold Algorithm for Garbage Collection in Log-Structured Arrays and File Systems" High Performance Computing Systems and Applications by J. Schaeffer, Kluwer Academic Publishers, 1998. (43 Pages).

Woodhouse, D. "JFFS: The Journalling Flash File System" Ottawa Linux Symposium. 2001. (12 Pages).

* cited by examiner

MANAGING HIGH PERFORMANCE STORAGE SYSTEMS WITH HYBRID STORAGE TECHNOLOGIES

BACKGROUND

Technical Field

The present invention relates generally to storage systems and, in particular, to managing high performance storage systems with hybrid storage technologies.

Description of the Related Art

Flash storage systems are usually designed to operate in a generic storage environment. This leads to sub-optimality in cost/performance and flash lifetime which indirectly leads to increased cost of operation and availability. Other types of solid state memories suffer from similar problems.

SUMMARY

According to an aspect of the present principles, there is provided a method for managing a solid state storage system with hybrid storage technologies. The method includes monitoring one or more storage request streams to identify operating mode characteristics therein from among a set of possible operating mode characteristics. The set of possible operating mode characteristics correspond to a set of available operating modes of the hybrid storage technologies. The method further includes identifying a current operating mode from among the set of available operating modes responsive to the identified operating mode characteristics. The method also includes predicting a likely future operating mode responsive to variations in workload requirements to generate at least one future operating mode prediction. The method additionally includes controlling at least one of data placement, wear leveling, and garbage collection, responsive to the at least one future operating mode prediction.

According to another aspect of the present principles, there is provided a computer readable storage medium including a computer readable program for managing a solid state storage system with hybrid storage technologies. The computer readable program when executed on a computer causes the computer to perform steps of a method. The method includes monitoring one or more storage request streams to identify operating mode characteristics therein from among a set of possible operating mode characteristics. The set of possible operating mode characteristics correspond to a set of available operating modes of the hybrid storage technologies. The method further includes identifying a current operating mode from among the set of available operating modes responsive to the identified operating mode characteristics. The method also includes predicting a likely future operating mode responsive to variations in workload requirements to generate at least one future operating mode prediction. The method additionally includes controlling at least one of data placement, wear leveling, and garbage collection, responsive to the at least one future operating mode prediction.

According to yet another aspect of the present principles, there is provided a solid state storage system with hybrid storage technologies. The storage system includes a monitor for monitoring one or more storage request streams to identify operating mode characteristics therein from among a set of possible operating mode characteristics, and identifying a current operating mode from among the set of available operating modes responsive to the identified operating mode characteristics. The set of possible operating mode characteristics correspond to a set of available operating modes of the hybrid storage technologies. The storage system further includes a predictor for predicting a likely future operating mode responsive to variations in workload requirements to generate at least one future operating mode prediction. The storage system also includes a controller for controlling at least one of data placement, wear leveling, and garbage collection, responsive to the at least one future operating mode prediction.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
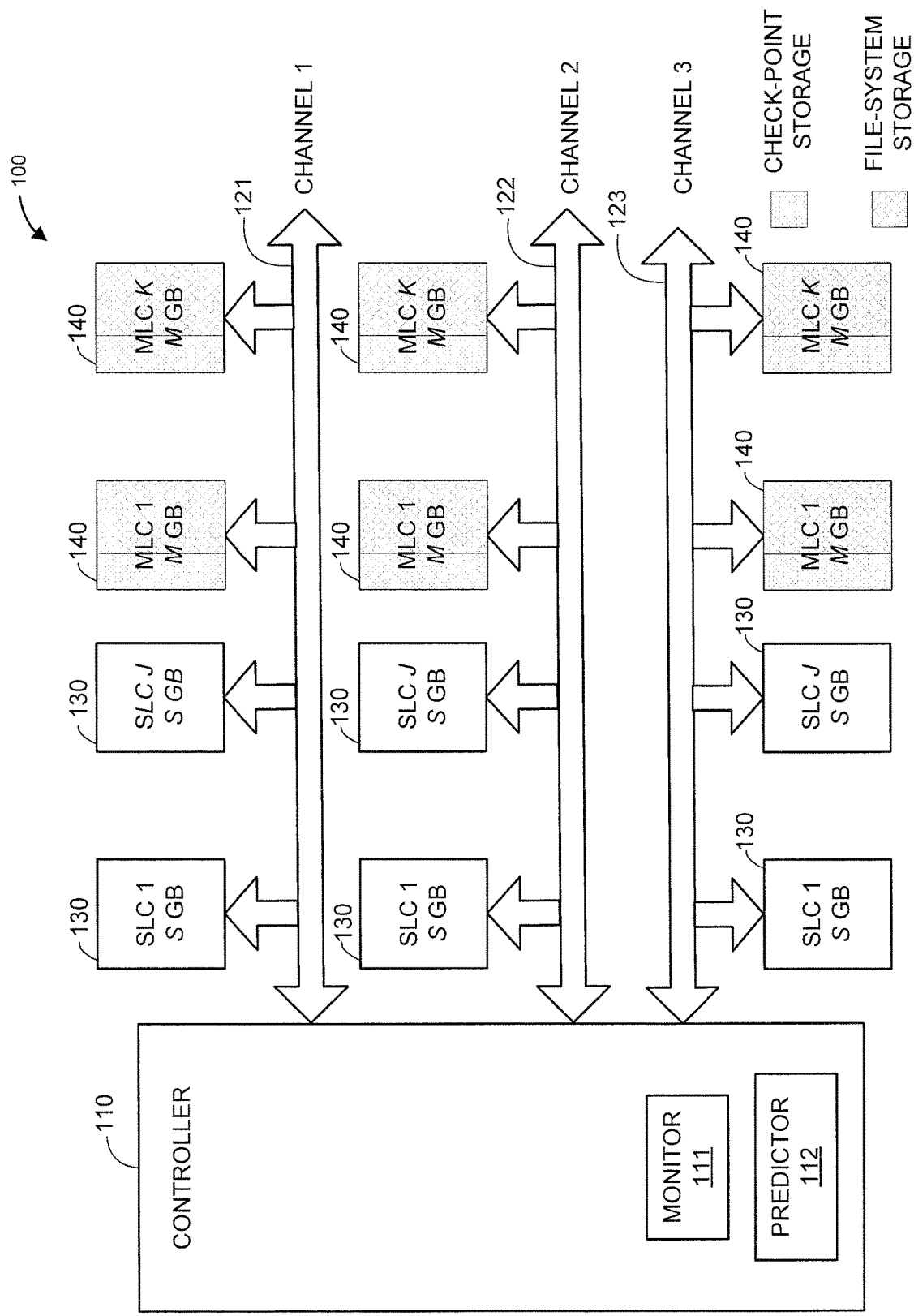
FIG. 1 shows an exemplary hybrid single-level cell/multi-level cell (SLC/MLC) checkpoint/file storage system 100, in accordance with an embodiment of the present principles.

The present principles are directed to managing high performance storage systems with hybrid storage technologies. In an embodiment, a unified storage system is provided for check-pointing and file storage, by intelligently combining different non-volatile memory technologies.

In an embodiment, the present principles advantageously exploit predictable phases in a storage operation that allows for an optimized usage of a flash storage layer. In further detail, in an embodiment, we isolate a number of modes of operation (e.g., write intensive, read intensive, mixed, light storage use, etc.) and utilize a monitor on the storage request stream to identify the characteristics of each mode and which mode is currently running. A predictive algorithm is used to predict the variation in the workload requirements with a relatively short time window (seconds) so as to be able to prepare the storage device to react with high performance when the mode of operation changes.

The knowledge of the mode of operation and its immediate future changes are then used to drive data placement (such as, for example, including possible duplication of data to improve read performance), garbage collection (such as, for example, proactive garbage collection to prepare the system for an imminent change to a write intensive mode of operation), and wear leveling (such as, for example, if a stream of short lived data is going to be written, data can be placed into a worn out region that meets but does not exceed the retention needs of the data stream itself).

In an embodiment, we exploit hybrid single-level cell/multi-level cell (SLC/MLC) flash storage pools and optimize data placement, garbage collection and wear leveling. In an embodiment, the SLC/MLC flash storage pools are combined into a Non-Uniform Flash Access (NUFA) storage system. This allows for the exploitation of the advantages of the technologies while avoiding the disadvantages thereof, since different non-volatile memory technologies offer trade-offs in write bandwidth/endurance and capacity (as well as in other metrics including, but not limited to, read bandwidth). To that end, we note that MLC flash requires a high capacity, while SLC flash requires a high write bandwidth and a high write endurance.

It is to be appreciated that while one or more embodiments of the present principles are described with respect to a hybrid SLC/MLC configuration, the present principles are not limited to the same and, thus, other hybrid configurations can also be used in accordance with the teachings of the present principles, while maintaining the spirit of the present principles. For example, in an embodiment, SLC can be used in two different ways (e.g., wear focused and wear delayed). These and other variations of hybrid are readily contemplated by one of ordinary skill in the art given the teachings of the present principles provided herein, while maintaining the spirit of the present principles.

Moreover, it is to be appreciated that the present principles can be applied to any type of solid state storage system including, but not limited to, a flash storage system, a phase change memory (PCM), and so forth. Thus, while or more embodiments of the present principles are described with respect to flash memories, the present principles are not solely limited to the same, as is readily appreciated by one of ordinary skill in the art given the teachings of the present principles provided herein, while maintaining the spirit of the present principles.

As noted above, in an embodiment of the present principles, check-pointing storage and file-system storage are combined in a unified storage system. However, check-pointing storage and file-system storage have very different requirements on physical attributes. For example, check-pointing is write-intensive. Check-pointing requires a high write bandwidth, a high write endurance, and a relatively low capacity. On the other hand, file-system storage is capacity-intensive. For example, file-system storage requires a high capacity and a relatively low write bandwidth/endurance.

As an example application to which the present principles can be applied, we describe the following directed to high performance computing (HPC). Exascale check-pointing storage requires gigabytes per second of write bandwidth, and hundreds of GBs capacity per second. Exascale file-system storage may require an order of magnitude more capacity, and an order of magnitude less write bandwidth. An embodiment of the present principles can advantageously combine exascale check-pointing storage and exascale file-system storage in an unified storage system to exploit the advantages of both types of storage systems while avoiding the disadvantages of the same.

FIG. 1 shows an exemplary hybrid single-level cell/multi-level cell (SLC/MLC) checkpoint/file storage system 100, in accordance with an embodiment of the present principles. In an embodiment, the system 100 is used in a high performance computing (HPC) application. The system 100 includes a Non-Uniform Flash Access (NUFA) flash controller 110, a monitor 111, a predictor 112, multiple buses 121, 122, and 123, single-level cells (SLCs) 130, and multi-level cells (MLCs) 140.

Each of the buses 121, 122, and 123 is connected to both SLCs 130 and MLCs 140. In particular, each of the buses 121, 122, and 123 is connected to a respective 1 through J SLCs 130 and a respective 1 through K MLCs 140. Thus, each of the buses 121, 122, and 123 is connected to different memory technologies (i.e., SLC versus MLC). Each of the SLCs 130 has S gigabytes of memory capacity. Each of the MLCs 140 has M gigabytes of memory capacity.

The MLCs 140 are configured to perform both checkpoint storage and file-system storage, as indicated by the legend in FIG. 1 showing the hatch patterns pertaining to each of these types of storage.

The flexible configuration of system 100 allows for different modes of operation, thus exploiting the different characteristics and cost tradeoffs of the different technologies.

A monitor 111 monitors the controller 110 to detect the current operating mode being used and switches the controller characteristics to follow the best model for that operating mode from among a limited set of operating modes.

The predictor 112 predicts at least one likely future operating mode responsive to variations in workload requirements to generate at least one future operating mode prediction.

The controller 110 controls at least one of data placement, wear leveling, and garbage collection, responsive to the at least one future operating mode prediction.

The operation of the elements of system 100 is further described herein below with respect to the method 200 of FIG. 2. In the embodiment of FIG. 1, the monitor 111 and the predictor 112 are shown as being incorporated in the controller 110. However, in other embodiments, the monitor 111 and/or the predictor 112 can be a separate entity with respect to the controller 110. These and other variations of system 100 are readily determined by one of ordinary skill in the art given the teachings of the present principles provided herein, while maintaining the spirit of the present principles.

Figure 2:
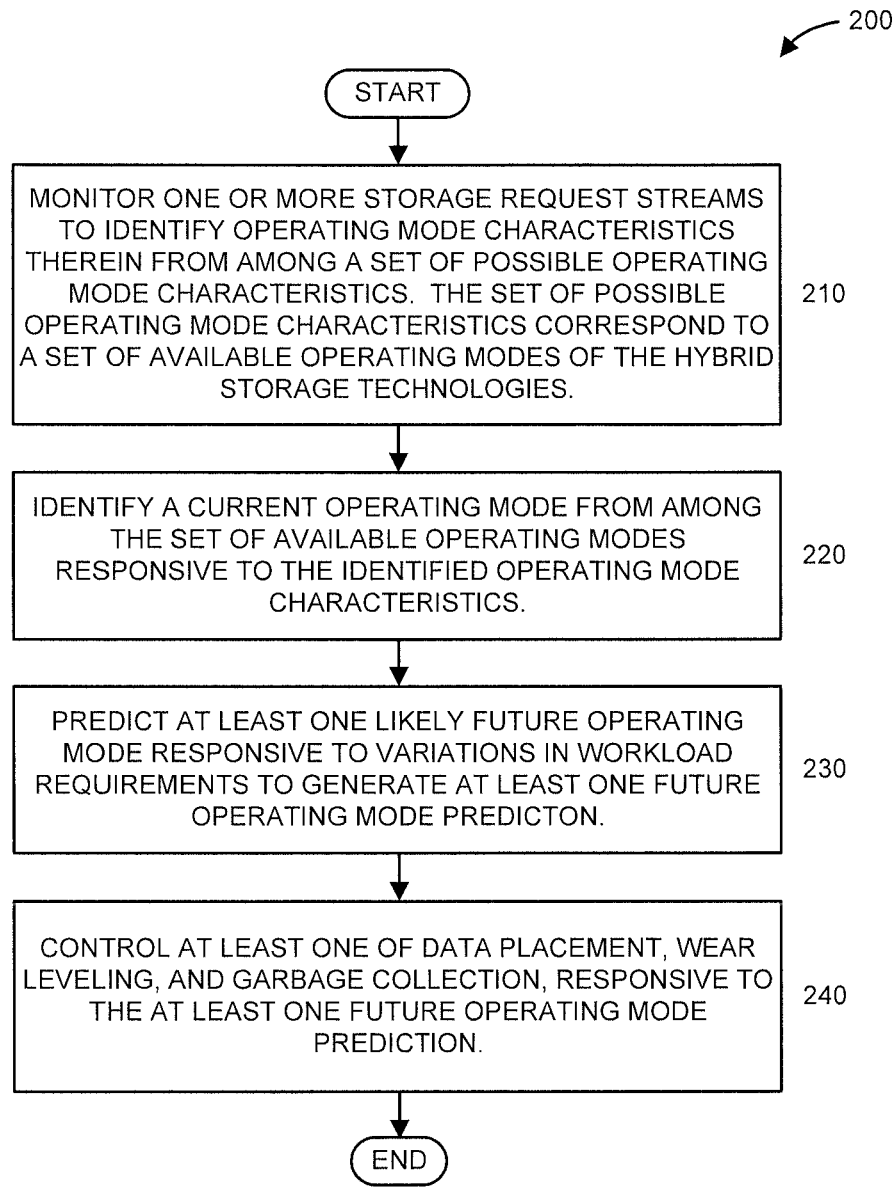
FIG. 2 shows an exemplary method 200 for managing a high performance storage system with hybrid storage technologies, in accordance with an embodiment of the present principles.

FIG. 2 shows an exemplary method 200 for managing a high performance storage system with hybrid storage technologies, in accordance with an embodiment of the present principles.

At step 210, monitor one or more storage request streams to identify operating mode characteristics therein from among a set of possible operating mode characteristics. In an embodiment, the monitoring can utilize inference algorithms known in the art to predict the evolution of the operating mode. These algorithms can include, but are not limited to, machine learning techniques, Bayesian prediction, Markov chain modeling, and so forth. Those skilled in the art will recognize that these techniques can be extended to any available technology suitable to state-evolution estimation.

Further regarding step 210, the set of possible operating mode characteristics correspond to a set of available operating modes of the hybrid storage technologies. The operating mode characteristics can include, but are not limited to: a number of reads over a given time period; a number of writes over a given time period; sequential write streams in the presence or in the absence of additional concurrent reads and writes; the presence of isolated reads (i.e., limited number of outstanding reads); the presence of a deep queue of reads (many outstanding reads, additional reads scheduled upon delivery of read completions from the flash), and so forth.

At step 220, identify a current operating mode from among the set of available operating modes responsive to the identified operating mode characteristics.

At step 230, predict at least one likely future operating mode responsive to variations in workload requirements to generate at least one future operating mode prediction. The workload variations can include, but are not limited to, a time evolution of the current mode of operation. The workload variations can be detected based on variations in operating mode characteristics.

At step 240, control at least one of data placement, wear leveling, and garbage collection, responsive to the at least one future operating mode prediction. In an embodiment, a selected combination can be controlled responsive to the at least one future operating mode prediction. In one embodiment, the control of data placement may include placing data from a data stream corresponding to at least one of the storage request streams in a worn out region of the storage system that meets without exceeding retention needs of the data stream, when a time period that the data is to be written is below a threshold time period.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for managing a solid state unified storage system with hybrid storage technologies comprising check-pointing storage and file-system storage, comprising:
   monitoring one or more storage request streams to identify operating mode characteristics therein from among a set of possible operating mode characteristics, the set of possible operating mode characteristics corresponding to a set of available operating modes of the hybrid storage technologies and including a number of reads over a given time period, a number of writes over the given time period, sequential write streams in the presence or in the absence of additional concurrent reads and writes, a presence of isolated reads, a presence of a deep queue of reads, the deep queue of reads including additional reads scheduled upon delivery of read completions from a flash for the unified storage system with hybrid storage technologies, the check-pointing storage having a lower capacity and being more write-intensive in comparison to the file-system storage, which has a higher capacity and is less write-intensive;
   identifying a current operating mode from among the set of available operating modes responsive to the identified operating mode characteristics;
   predicting a future operating mode responsive to variations in workload requirements to generate at least one future operating mode prediction, the workload variations including a time evolution of the current operating mode; and
   controlling, using a controller, at least one of data placement, wear leveling, garbage collection, and read performance of the storage system, responsive to the at least one future operating mode prediction, the controller being configured for improving the read performance of the storage system by placing duplicate data in the storage system.

2. The method of claim 1, wherein said controlling step comprises placing data from a data stream corresponding to at least one of the storage request streams in a worn out region of the storage system that meets without exceeding retention needs of the data stream, when a time period that the data is to be written is below a threshold time period.

3. The method of claim 1, wherein the hybrid storage technologies comprise single-level cell technology and multi-level cell technology.

4. The method of claim 1, wherein the hybrid storage technologies comprise a same storage technology used in at least two different ways.

5. The method of claim 4, wherein the hybrid storage technologies comprise single-level cell technology configured to be wear focused and the single-level cell technology configured to be wear delayed.

6. The method of claim 1, wherein the storage system is one of a flash storage system and a phase change memory (PCM).

7. A non-transitory computer readable storage medium comprising a computer readable program for managing a solid state unified storage system with hybrid storage technologies comprising check-pointing storage and file-system storage, wherein the computer readable program when executed on a computer causes the computer to perform the steps of:
   monitoring one or more storage request streams to identify operating mode characteristics therein from among a set of possible operating mode characteristics, the set of possible operating mode characteristics corresponding to a set of available operating modes of the hybrid storage technologies and including a number of reads over a given time period, a number of writes over the given time period, sequential write streams in the presence or in the absence of additional concurrent reads and writes, a presence of isolated reads, a presence of a deep queue of reads, the deep queue of reads including additional reads scheduled upon delivery of read completions from a flash for the unified storage system with hybrid storage technologies, the check-pointing storage having a lower capacity and being more write-intensive in comparison to the file-system storage, which has a higher capacity and is less write-intensive;
   identifying a current operating mode from among the set of available operating modes responsive to the identified operating mode characteristics;
   predicting a future operating mode responsive to variations in workload requirements to generate at least one future operating mode prediction, the workload variations including a time evolution of the current operating mode; and controlling, using a controller, at least one of data placement, wear leveling, garbage collection, and read performance of the storage system, responsive to the at least one future operating mode prediction, the controller being configured for improving the read performance of the storage system by placing duplicate data in the storage system.

8. The computer readable storage medium of claim 7, wherein said controlling step comprises placing data from a data stream corresponding to at least one of the storage request streams in a worn out region of the storage system that meets without exceeding retention needs of the data stream, when a time period that the data is to be written is below a threshold time period.

9. The computer readable storage medium of claim 7, wherein the hybrid storage technologies comprise single-level cell technology and multi-level cell technology.

10. The computer readable storage medium of claim 7, wherein the hybrid storage technologies comprise a same storage technology used in at least two different ways.

11. The computer readable storage medium of claim 10, wherein the hybrid storage technologies comprise single-level cell technology configured to be wear focused and the single-level cell technology configured to be wear delayed.

12. The computer readable storage medium of claim 7, wherein the storage system is one of a flash storage system and a phase change memory (PCM).

13. A solid state unified storage system with hybrid storage technologies comprising check-pointing storage and file-system storage, comprising:
a monitor for monitoring one or more storage request streams to identify operating mode characteristics therein from among a set of possible operating mode characteristics, and identifying a current operating mode from among the set of available operating modes responsive to the identified operating mode characteristics, the set of possible operating mode characteristics corresponding to a set of available operating modes of the hybrid storage technologies and including a number of reads over a given time period, a number of writes over the given time period, sequential write streams in the presence or in the absence of additional concurrent reads and writes, a presence of isolated reads, a presence of a deep queue of reads, the deep queue of reads including additional reads scheduled upon delivery of read completions from a flash for the unified storage system with hybrid storage technologies, the check-pointing storage having a lower capacity and being more write-intensive in comparison to the file-system storage, which has a higher capacity and is less write-intensive;
a predictor for predicting a future operating mode responsive to variations in workload requirements to generate at least one future operating mode prediction, the workload variations including a time evolution of the current operating mode; and
a controller configured for controlling at least one of data placement, wear leveling, garbage collection, and read performance of the storage system responsive to the at least one future operating mode prediction, the controller being further configured for improving the read performance of the storage system by placing duplicate data in the storage system.

14. The system of claim 13, wherein said controller places data from a data stream corresponding to at least one of the storage request streams in a worn out region of the storage system that meets without exceeding retention needs of the data stream, when a time period that the data is to be written is below a threshold time period.

* * * * *